(12) United States Patent
Maroo et al.

(10) Patent No.: US 10,881,034 B2
(45) Date of Patent: Dec. 29, 2020

(54) PASSIVE NANO-HEAT PIPES FOR COOLING AND THERMAL MANAGEMENT OF ELECTRONICS AND POWER CONVERSION DEVICES

(71) Applicants: Shalabh C. Maroo, Syracuse, NY (US); An Zou, Cortland, NY (US); Manish Gupta, Syracuse, NY (US)

(72) Inventors: Shalabh C. Maroo, Syracuse, NY (US); An Zou, Cortland, NY (US); Manish Gupta, Syracuse, NY (US)

(73) Assignee: Syracuse University, Syracuse, NY (US)

( * ) Notice: Subject to any disclaimer, the term of this patent is extended or adjusted under 35 U.S.C. 154(b) by 0 days.

(21) Appl. No.: 16/196,838

(22) Filed: Nov. 20, 2018

(65) Prior Publication Data
US 2019/0159368 A1    May 23, 2019

Related U.S. Application Data

(60) Provisional application No. 62/589,202, filed on Nov. 21, 2017.

(51) Int. Cl.
*H05K 7/20* (2006.01)
*H01L 23/427* (2006.01)
(Continued)

(52) U.S. Cl.
CPC ......... *H05K 7/20936* (2013.01); *F28D 15/00* (2013.01); *H01L 23/427* (2013.01);
(Continued)

(58) Field of Classification Search
CPC .................................................. H01L 23/427
See application file for complete search history.

(56) References Cited

U.S. PATENT DOCUMENTS

| | | | | |
|---|---|---|---|---|
| 5,788,766 | A * | 8/1998 | Yamamoto | G21K 1/10 117/89 |
| 6,283,718 | B1 * | 9/2001 | Prosperetti | F04B 19/006 347/56 |

(Continued)

OTHER PUBLICATIONS

Kamali, Reza et al., Optimization of Transitional Nano-Channel Cooling Heat Sink Using a Genetic Algorithm, Proceedings of the Sixth International ASME Conference on Nanochannels, Microchannels and Minichannels, ICNMM2008-62247, Jun. 23-25, 2008, Darmstadt, Germany, pp. 1-6. (Year: 2008).*

(Continued)

*Primary Examiner* — Robert J Hoffberg
(74) *Attorney, Agent, or Firm* — Bond Schoeneck & King, PLLC; David Nocilly; George McGuire

(57) ABSTRACT

A cooling device for a heat source, such as an electronic component, has a single or set of nano- and/or micro-sized channel(s) connected to a single or multiple reservoir(s). The heat source causes nucleation within a channel, and a vapor bubble forms removing heat from the heat source via evaporation of liquid to vapor in the bubble and condensation of the generated vapor at the cooler ends of the bubble. Thus, the channel operates as a passive heat pipe and removes heat from the source by passively circulating the cooling fluid between the vapor bubble and the reservoir(s).

12 Claims, 7 Drawing Sheets

(51) Int. Cl.
*F28D 15/00* (2006.01)
*F28D 15/02* (2006.01)

(52) U.S. Cl.
CPC ..... *H05K 7/20309* (2013.01); *H05K 7/20318* (2013.01); *H05K 7/20327* (2013.01); *H05K 7/20336* (2013.01); *F28D 15/0283* (2013.01); *F28D 2015/0225* (2013.01)

(56) References Cited

U.S. PATENT DOCUMENTS

| | | | | |
|---|---|---|---|---|
| 6,942,018 | B2* | 9/2005 | Goodson | F04B 19/006 165/104.21 |
| 7,110,258 | B2* | 9/2006 | Ding | F28D 15/0266 174/15.1 |
| 7,323,140 | B2* | 1/2008 | Handique | B01L 3/502723 204/193 |
| 7,942,643 | B2* | 5/2011 | Cho | F04B 19/24 417/207 |
| 8,479,806 | B2* | 7/2013 | Qu | F28F 3/048 165/80.4 |
| 8,891,949 | B2* | 11/2014 | Hong | F04B 19/006 392/471 |
| 9,557,118 | B2* | 1/2017 | Salamon | F28D 15/0266 |
| 10,217,692 | B2* | 2/2019 | Haj-Hariri | F28D 15/0233 |
| 10,420,254 | B2* | 9/2019 | Balasubramanian | F28F 3/02 |
| 2006/0225908 | A1* | 10/2006 | Ding | F28D 15/0266 174/15.6 |
| 2008/0073061 | A1* | 3/2008 | Dias | H01L 23/427 165/80.4 |
| 2012/0243180 | A1* | 9/2012 | Lee | F28F 3/027 361/702 |
| 2014/0090815 | A1* | 4/2014 | Salamon | F28D 15/0266 165/104.26 |
| 2015/0198380 | A1* | 7/2015 | Haj-Hariri | B64G 1/50 62/3.2 |

OTHER PUBLICATIONS

Khan, W. A et al., Analytical Modeling of Fluid Flow and Heat Transfer in Microchannel/Nanochannel Heat Sinks, Journal of Thermophysics and Heat Transfer, vol. 22, No. 3, Jul.-Sep. 2008, pp. 352-359. (Year: 2008).*
E. Ory, H. Yuan, A. Prosperetti, S. Popinet, S. Zaleski. Growth and collapse of a vapor bubble in a narrow tube. Physics of Fluids, American Institute of Physics, 2000, 12 (6), pp. 1268-1277. ff10. 1063/1.870381ff. ffhal-01445440f (Year: 2000).*

* cited by examiner

PASSIVE NANO-HEAT PIPES FOR COOLING AND THERMAL MANAGEMENT OF ELECTRONICS AND POWER CONVERSION DEVICES

CROSS-REFERENCE TO RELATED APPLICATIONS

The present application claims priority to U.S. Provisional Application No. 62/589,202, filed on Nov. 21, 2017.

STATEMENT REGARDING FEDERALLY SPONSORED RESEARCH AND DEVELOPMENT

This invention was made with government support under Grant No. 1454450 awarded by the National Science Foundation (NSF). The government has certain rights in the invention.

BACKGROUND OF THE INVENTION

1. Field of the Invention

The present invention relates to heat sinks for electronic components and, more particularly, to nano- and/or microchannels that are embedded in a substrate and act as heat pipes and shunt heat from electronic components.

2. Description of the Related Art

Electronic devices and power conversion devices, such as integrated circuits, laser diodes, and concentrated photovoltaics, etc., generate heat and require cooling to maintain the device within a desired operating temperature limit to avoid premature failure. As a result, thermal management solutions are required for cooling currently available electronics and also for developing next-generation high performance electronics. In fact, heat dissipation from electronic equipment have been one of the major areas of application in modern heat transfer technology and the improvements in reliability, power capacity and physical miniaturization of electronic components are directly dependent on their thermal control level. As a result, there is a need in the art for a thermal management approach that can remove significant heat flux (heat transfer per unit area) from the device while being easy to implement.

BRIEF SUMMARY OF THE INVENTION

The present invention provides improved thermal management with a cooling device for an electronic component that has a substrate having at least one channel formed therein, at least one reservoir positioned at an end of and in fluid communication with the channel, and a coolant capable of a reversible liquid to vapor transition positioned in the channel. A cover may be positioned over the reservoir and a conventional heat sink may be associated with the cover. The channel may have a height of at least 5 nanometers, a width of at least 5 nanometers, and a length of at least 5 nanometers. The reservoir may be at least 100 nanometers in length, width or depth. The liquid may be water, a conventional electronics coolant liquid such as FC-72, glycols/alcohols, or a conventional refrigerant such as R-112. The device is positioned against the heat source of the electronic component so that the at least one channel is operatively aligned with the heat source. When the heat source increases in temperature, nucleation occurs inside the embedded channels that are exposed to the heat source to form an elongated vapor bubble in each affected channel. Each vapor bubble and corresponding channel acts as a passive heat pipe to remove the heat from the heat source via the evaporation of liquid into the bubble and condensation of vapor near the cooler ends of the bubble. Cooler liquid is passively delivered to the heated region (where evaporation is occurring) by the reduced liquid pressure occurring in the thin film present between the bubble and the walls of the channel.

The present invention also includes a method of cooling an electronic component by providing a cooling device comprising a substrate having at least one channel formed therein, at least one reservoir positioned at an end of and in fluid communication with the channel, and a coolant capable of a reversible liquid to vapor transition positioned in the channel, wherein the cooling device is positioned along the electronic device so that a heat source of the electronic device is operatively coupled to the channel of the cooling device. Providing the cooling device may comprise integrally forming the cooling device with the electronic device. Providing the cooling device may instead comprise placing a separate cooling device against the electronic device. The method may further include the step of allowing the heat source of the electronic device to cause the liquid in the channel to vaporize and form a vapor bubble in the channel. The method may additionally include the step of cooling the reservoir so that vapor near an end of the bubble condenses.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
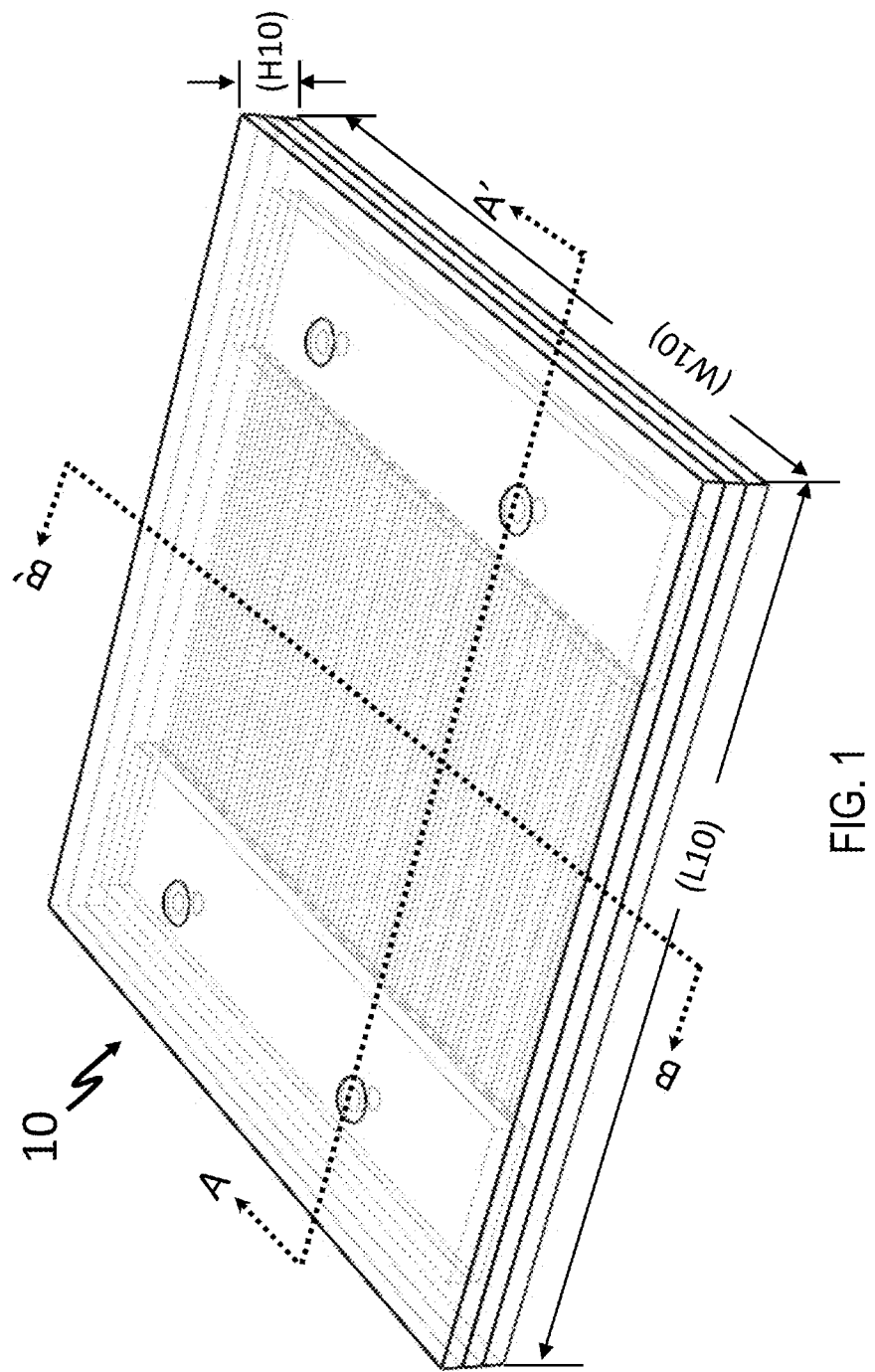
FIG. 1 is a perspective view of an electronic component cooling device for positioning on an electrical component having a heat source to be cooled according to the present invention.
Figure 2:
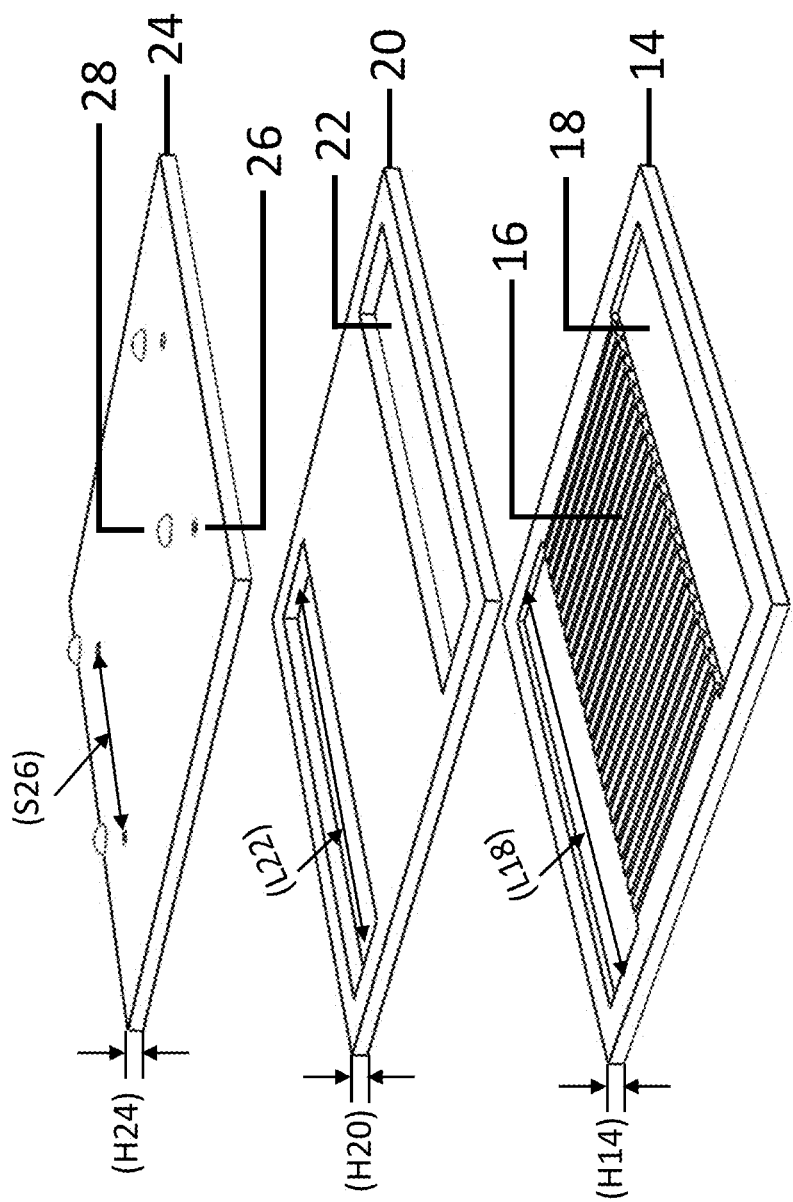
FIG. 2 is an exploded view of an electronic component cooling device according to the present invention.

Referring to the figures, wherein like numeral refer to like parts throughout, there is seen in FIGS. 1 and 2 a device 10 according to the present invention for providing cooling to an associated electronic component 12. Device 10 comprises a substrate 14 having a set of channels 16 formed therein that are preferably nano- to micro-sized (approximately from 5 nm to 10000 nm) in communication with reservoirs 18 (approximately from 100 nm) extending transversely to channels 16. Channels 16 are embedded in substrate 14 and extend laterally through substrate 14 into communication with reservoirs 18. A bonding plate 20 is positioned over substrate 14 and defines extended reservoirs 22 in communication with reservoirs 18. A closing plate 24 is positioned over bonding plate 20 and includes a set of inlets 26 permitting access to extended reservoirs 22, and thus to reservoirs 18 and channels 16, for the purposes of introducing a cooling liquid as further described herein. Sealing caps 28 allow for selective opening and closing of inlets 26. The number of channels 16 can vary from one to multiple as required to provide adequate coverage of the electronic component 12 over which device 10 is positioned to provide cooling. Substrate 14 may be a material having desired thermal conductivity, such as silicon, copper, etc. Device 10 is positioned against a heat source, such as the portion of a target electronic component 12 that are subject to overheating and to be cooled. Alternatively, device 10 may be fabricated along with and as an integral part of the electronic component 12.

Figure 3:
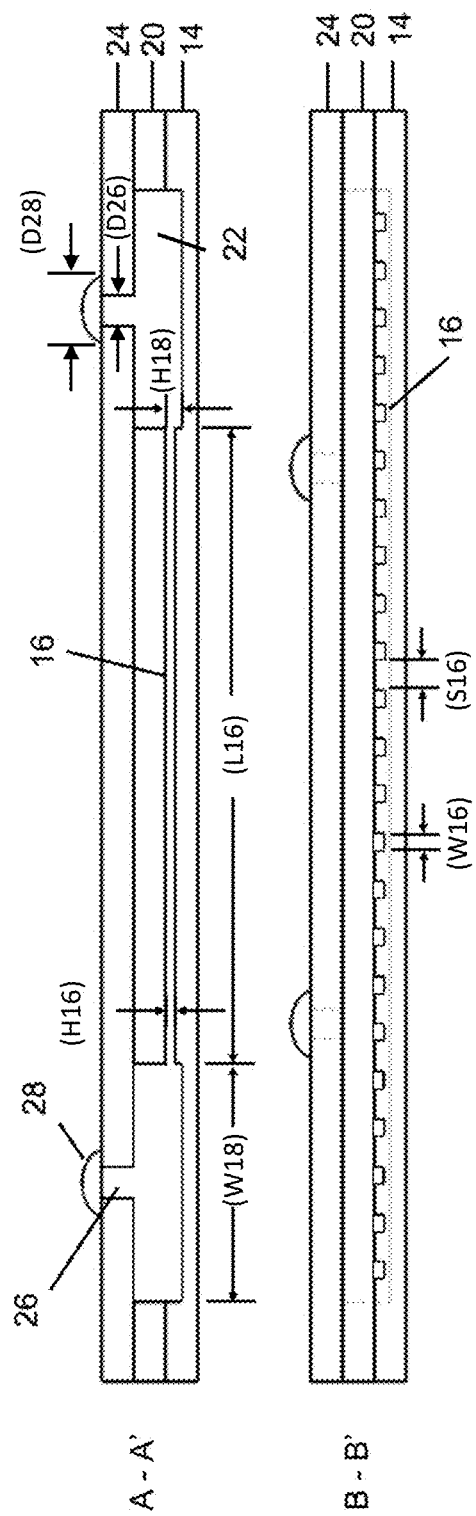
FIG. 3 are two cross-sectional views of an electronic component cooling device according to the present invention taken along lines A-A and B-B of FIG. 1.

Referring to FIG. 3, the depth (H16) of each channel 16 is preferably between 5 nm and 10000 nm (10 μm). The width (W16) and length (L16) of each channel is greater than 5 nm and can be as large as in the micrometer or millimeter or centimeter scale. The cross-sectional geometry of channel 16 can be any shape (i.e. rectangle, square, circle, etc.) provided the geometry has the aforementioned dimensions and scale associated. Channels 16 are also spaced apart a predetermined distance (s) from each other. Reservoirs 18 and extended reservoirs 22 may be approximately 5 nm sized or larger (even into the micrometer or millimeter or centimeter scale) in width (W18 and W22) and length (L18 and L22), and also partially or completely formed in substrate 14 of device 10.

Referring to FIG. 1, the length (L10), width (W10) and height (H10) of device 10 can be varied from approximately 100 nm to centimeter scale. Referring to FIG. 2, the thickness of substrate 14 (H14), bonding plate 20 (H20), and closing plate 24 (H24) can be varied from approximately 100 nm to centimeter scale. Referring to FIG. 3, spacing (S16) between two coolant channels can be varied from 5 nm onward. Diameter of coolant inlets 26 (D26) can be varied from nanometer scale (5 nm) to centimeter scale (5 cm).

Channels 16, reservoirs 18 and extended reservoirs 22 are filled with a liquid, such as water or an electronics coolant liquid like FC-72 (thermally and chemically stable liquid available from 3M as Fluorinert™), or any other liquid appropriate for thermal management of a specific device. Liquid should be capable of undergoing a reversible liquid to vapor conversion, i.e., liquid must be able to vaporize in the middle of channel 16 in response to the heat source of device 12, and condense into the liquid at the cooler ends of vapor bubble formed in channel 16. Extended reservoirs 22 are sealed with closing plate 24, and closing plate 24 may be cooled via a conventional electronic component heat sink such as a thermoelectric cooler (Peltier plates), a heat spreader, cold plates, fans, etc., or a combination of them. Closing plate 24 may comprise more than one material to both seal the device and to conduct heat from one or more reservoirs 18 to the conventional heat sink. Closing plate 24 may thus be made from materials such as silicon, copper, PDMS, etc.

Figure 4:
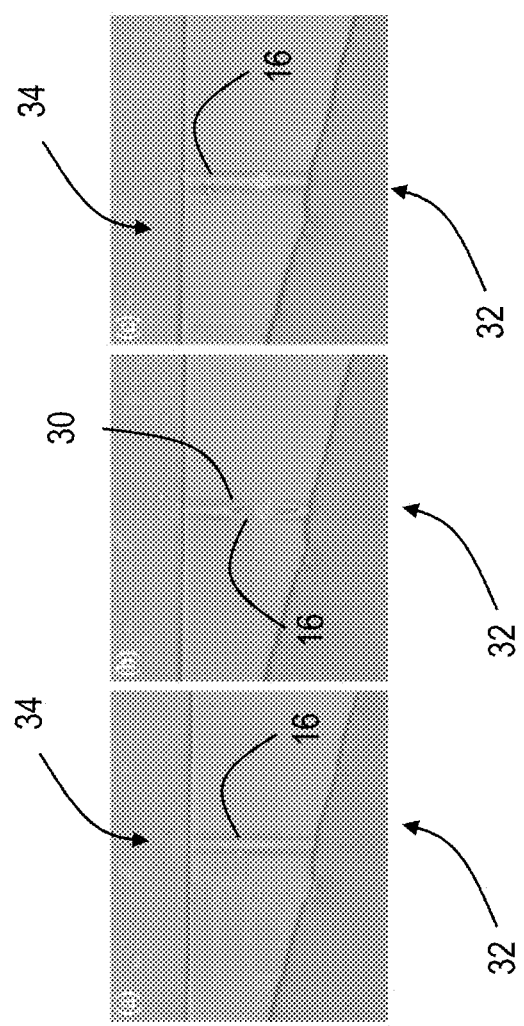
FIG. 4 is a set of images showing formation of vapor bubbles in the channel of an exemplary cooling device according to the present invention.

Referring to FIGS. 3 and 4, device 10, according to the present invention, operates by forming an elongated vapor bubble 30 in embedded channel 16 as the liquid in channel 16 is heated by electronic device 12. The combination of vapor bubble 30 and channel 16 act as a heat pipe and remove heat from the electronic component 12 through the evaporation of the liquid inside the bubble to vapor, in combination with the condensation of the vapor near the ends of the bubble proximate to the cooled reservoir(s) 18. Cooler liquid is passively delivered to the heated region (where evaporation is occurring) by the reduced liquid pressure occurring in the thin film present between vapor bubble 30 and the walls of channel 16. The reduced pressure is determined by the combination of capillary effect, disjoining effect, and Marangoni effect. For proper operation of device 10 as a passive heat pipe, each channel length must be greater than at least one dimension of the region in the source where heat is being produced.

Referring to FIG. 4, the operation of a prototype embodiment of device 10 is shown with a single channel 16, a first reservoir 32 filled with liquid water, and a second reservoir 34 that is dry. Channel 16 is 100 nanometers in height, 10 micrometers in width, and 100 micrometers in length. Channel 16 gets completely filled with water, as seen in the first image showing the initial state of FIG. 4. When an exemplary heat source under channel 16 is turned on, a stable vapor bubble 30 forms, as seen in the second image of FIG. 4. Heat is dissipated from the source to the water in channel 16 and then to the reservoir by a combination of evaporation and condensation. Channel 16 thus behaves as a passive heat pipe. When the heat source under channel 16 is turned off, bubble 30 collapses and channel 16 is completely rewetted, as seen in the last image of FIG. 4, thus returning to the initial state seen in FIG. 4. In the initial state, device 10 is again ready to provide cooling if the heat source is turned on again. In a test of a single channel 16 of 100 nanometer in height, 10 micrometers in width, and 100 micrometers in length, heat flux removal of at least 1000 W/cm$^2$ was achieved.

Figure 5:
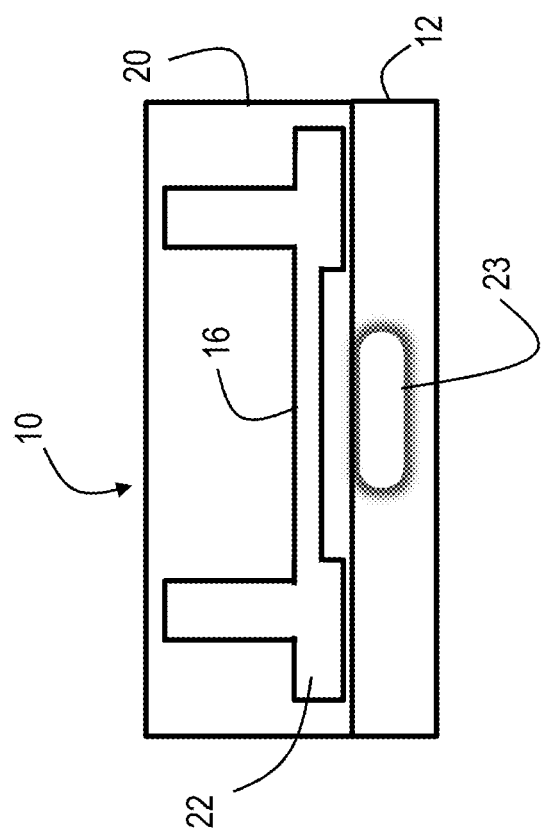
FIG. 5 is a schematic of an electronic component cooling device having a substrate that is adapted to position the relevant features of the present invention more closely to the heat source 23 of an electrical component to be cooled according to the present invention.

Referring to FIG. 5, the channel 16 can be fabricated on a thinner substrate 14, or the outer surface of device 10 may be shaped to operatively align channel 16 with the heat source of electronic device 12 and to bring channel 16 and the heat source into close proximity with each other.

Figure 6:
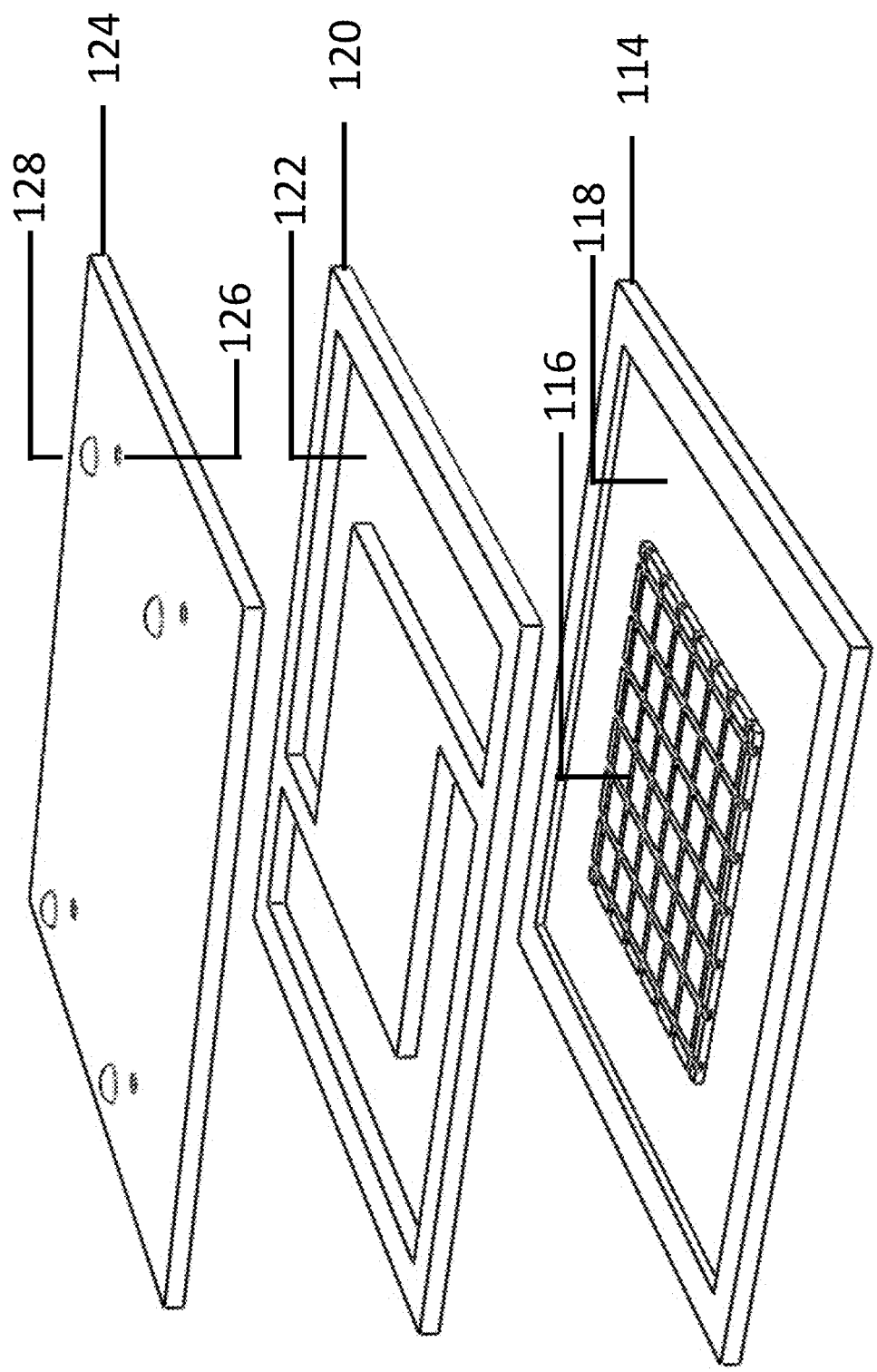
FIG. 6 is an exploded view of an alternative embodiment of an electronic component cooling device according to the present invention.

Referring to FIG. 6, in another embodiment, the present invention comprises a device 100 having a substrate plate 114 having crossed channels 116 and a reservoir 118 extending around the periphery of channels 116. Bonding plate 120 defines extended reservoirs 122 that can be L-shaped to extend across two sides of the grid formed by crossed channels 116. As described above, closing plate 124 includes inlets 126 and sealing caps 128.

Figure 7:
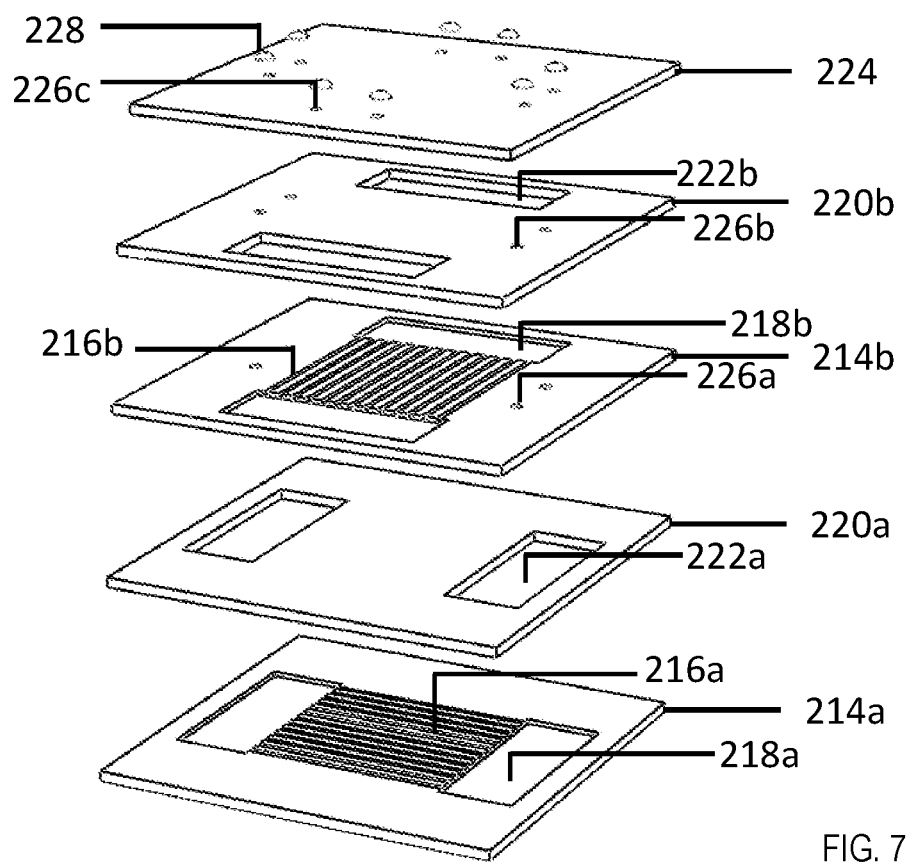
FIG. 7 is an exploded view of yet another embodiment of an electronic component cooling device according to the present invention.

Referring to FIG. 7, in a further embodiment, the present invention comprises an assembly 200 having a first substrate plate 214a with a first set of channels 216a formed therein. A first bonding plate 220a defining a first set of reservoirs 218a is positioned over first substrate 214a to define a first set of extended reservoirs 222a in communication with reservoirs 218a and channels 216a. A second substrate plate 214b with a second set of channels 216b formed therein is positioned over first bonding plate 220a. Second substrate plate 214b includes a first set of inlets 226a formed there that permit fluid access to first set of extended reservoirs 222a. A second bonding plate 220b defining a second set of reservoirs 218b is positioned over second substrate 214b to define a second set of extended reservoirs 222b in communication with second set of reservoirs 218b and second set of channels 216b. Second bonding plate 220b also includes a second set of inlets 226b aligned with first set of inlets 226a to permit liquid coolant to be added to first set of channels 216a, first set of reservoirs 218a, and first set of extended reservoirs 222a. A closing plate 224 is positioned over second bonding plate 220b and includes a third set of inlets 226c permitting access to second set of extended reservoirs 222b and also to second set of inlets 226b, and thus to second set of reservoirs 218b and second set of channels 216b. As seen in FIG. 7, first set of channels 216a and second set of channels 216b may be orientated at right angles to each other to improve overall performance of assembly 200.

The invention claimed is:

1. A device for providing cooling to an electronic component, comprising:
   a substrate having at least one channel embedded in the substrate, wherein the at least one channel has a depth of between 5 nanometers and 10,000 nanometers, a width of at least 5 nanometer, and a length of at least 5 nanometers;
   a plate positioned over the substrate and enclosing a top of the at least one channel;
   at least one reservoir embedded in the substrate and passing through the plate, the at least one reservoir positioned at at least one end of and in fluid communication only with the at least one channel;
   a cover positioned over the plate and enclosing a top of the at least one reservoir; and
   a coolant capable of a reversible liquid to vapor transition, the coolant positioned only in the at least one channel and the at least one reservoir,
   wherein the substrate, the plate, and the cover seal the coolant in the at least channel and the at least one reservoir.

2. The device of claim 1, further comprising a heat sink associated with the cover.

3. The device of claim 1, wherein the liquid is water.

4. The device of claim 1, wherein the liquid is a dielectric fluid.

5. The device of claim 1, wherein the liquid is selected from a group consisting of glycols, alcohols and combinations thereof.

6. The device of claim 1, wherein the liquid is a refrigerant.

7. The device of claim 1, wherein the device is positioned against a heat source associated with the electronic component so that the at least one channel is operatively aligned with the heat source.

8. A method of cooling an electronic component, comprising steps of:
   providing a cooling device, the cooling device including:
   a substrate having at least one channel embedded in the substrate, wherein the at least one channel has a depth of between 5 nanometers and 10,000 nanometers, a width of at least 5 nanometers, and a length of at least 5 nanometers,
   a plate positioned over the substrate and enclosing a top of the at least one channel;
   at least one reservoir embedded in the substrate and passing through the plate, the at least one reservoir positioned at at least one end of the length and in fluid communication only with the at least one channel,
   a cover positioned over the plate and enclosing a top of the at least one reservoir; and
   a coolant capable of a reversible liquid to vapor transition, the coolant positioned only in the at least one channel and the at least one reservoir,
   wherein the substrate, the plate, and the cover seal the coolant in the at least channel and the at least one reservoir, and
   wherein the cooling device is positioned along the electronic component so that a heat source of the electronic device is thermally coupled to the at least one channel of the cooling device.

9. The method of claim 8, wherein the step of providing the cooling device comprises integrally forming the cooling device with the electronic component.

10. The method of claim 8, wherein the step of providing the cooling device comprises placing a separate cooling device against the electronic component.

11. The method of claim 8, further comprising a step of allowing the heat source of the electronic component to cause the liquid in the at least one channel to vaporize and form a vapor bubble of the vapor in the at least one channel.

12. The method of claim 11, further comprising a step of cooling the at least one reservoir so that the vapor condenses within the vapor bubble at ends of the vapor bubble.

* * * * *